United States Patent
Bae et al.

(10) Patent No.: US 8,144,527 B2
(45) Date of Patent: Mar. 27, 2012

(54) SEMICONDUCTOR MEMORY DEVICE

(75) Inventors: Ji-Hyae Bae, Kyoungki-do (KR);
Sang-Sik Yoon, Kyoungki-do (KR)

(73) Assignee: Hynix Semiconductor Inc.,
Kyoungki-do (KR)

( * ) Notice: Subject to any disclaimer, the term of this patent is extended or adjusted under 35 U.S.C. 154(b) by 403 days.

(21) Appl. No.: 12/005,999

(22) Filed: Dec. 28, 2007

(65) Prior Publication Data

US 2009/0059693 A1  Mar. 5, 2009

(30) Foreign Application Priority Data

Sep. 3, 2007  (KR) .................. 10-2007-0088871

(51) Int. Cl.
*G11C 7/00* (2006.01)

(52) U.S. Cl. .................. 365/193; 365/189.05
(58) Field of Classification Search .................. 365/193, 365/189.02, 189.05, 233.1
See application file for complete search history.

(56) References Cited

U.S. PATENT DOCUMENTS

| | | | |
|---|---|---|---|
| 6,442,103 B1 * | 8/2002 | Kwak et al. | 365/233.16 |
| 6,496,429 B2 * | 12/2002 | Murai et al. | 365/200 |
| 7,692,982 B2 | 4/2010 | Yoon | |
| 2008/0219064 A1 * | 9/2008 | Yoon | 365/189.16 |
| 2008/0225603 A1 | 9/2008 | Hein | |

FOREIGN PATENT DOCUMENTS

| KR | 10-2006-0026661 A | 9/2004 |
|---|---|---|
| KR | 10-0557221 | 3/2006 |

OTHER PUBLICATIONS

*Qimonda GDDR5—White Paper*, www.qimonda.com, Aug. 2007, pp. 1-10.

* cited by examiner

*Primary Examiner* — Anh Phung
(74) *Attorney, Agent, or Firm* — Blakely Sokoloff Taylor & Zafman

(57) ABSTRACT

A semiconductor memory device includes: a data multiplexing unit configured to output one of a data training pattern and data transferred through a first global input/output line in response to a training control signal; and a latch unit configured to latch an output of the data multiplexing unit to apply and maintain the latched output to a second global input/output line.

10 Claims, 3 Drawing Sheets

SEMICONDUCTOR MEMORY DEVICE

CROSS-REFERENCE TO RELATED APPLICATIONS

The present invention claims priority of Korean patent application number 10-2007-0088871, filed on Sep. 3, 2007, which is incorporated by reference in its entirety.

BACKGROUND OF THE INVENTION

The present invention relates to a semiconductor memory device, and more particularly, to a semiconductor memory device and a method for transferring data at high speed in data read and write operations.

In a system including a plurality of semiconductor devices, a semiconductor memory device serves as a data storage. The semiconductor memory device outputs data corresponding to addresses received from a data processor, e.g., a central processing unit (CPU), or stores data received from the data processor into unit cells corresponding to addresses inputted together with the data.

As the operating speed of the system is increasing and the semiconductor integrated circuit (IC) technology is advanced, the semiconductor memory device is required to input/output data at higher speed. In order for a stable and high-speed operation of the semiconductor memory device, various circuits inside the semiconductor memory device should operate at high speed and transfer data or signals between circuits at high speed.

Practically, the operation of the semiconductor memory device is delayed by various control circuits for reading data from memory cells or transferring external data to selected memory cells, connection lines and connection circuits for transferring the data, and so on. Delay time occurs when the data outputted from the semiconductor memory device is transferred to a data requesting device of the system. In the system operating at high speed, delay time in transferring signals and data causes to deteriorate the performance of the system, and operation reliability and stability. Delay time in a data transfer path is variable depending on operation environment, which affects the operation of the semiconductor memory device.

Generally, the operation performance of the semiconductor memory device is further improved as a semiconductor memory device outputs data stored in memory cells in a read operation after a command is inputted from an external device. Particularly, in a semiconductor memory device used for graphic work in which a large amount of data is processed, a time required for outputting data becomes a critical performance index. In addition, when the data outputted from the semiconductor memory device are accurately transferred to various processors, the system effectively operates.

FIG. 1 is a timing diagram illustrating a read operation of a conventional semiconductor memory device. Specifically, FIG. 1 illustrates a data exchange process between a related art double data rate (DDR) semiconductor memory device for graphic work and a graphic processing unit (GPU) for processing image data.

Referring to FIG. 1, in the read operation, the DDR semiconductor memory device outputs data DRAM_DATA corresponding to a request of the GPU in synchronization with a rising edge and a falling edge of a memory clock DRAM_CLK. The GPU reads a data value received at a rising edge and a falling edge of a graphic clock GPU_CLK. In this case, when the rising edge and the falling edge of the graphic clock GPU_CLK exist in an effective window of data outputted from the DDR semiconductor memory device, the GPU can receive the data.

In a data transfer process, a data delay time from t0 to t2 occurs due to physical factors between the DDR semiconductor memory device and the GPU. In the DDR semiconductor memory device, data is outputted in synchronization with each edge of a clock, but in the GPU, the data can be accurately received in the case where an edge of a clock is positioned in an effective window of the data and more precisely at the center of the effective window. Accordingly, an optimal phase difference between the memory clock DRAM_CLK and the graphic clock GPU_CLK becomes 0.5×UI, wherein the UI indicates the effective window. In this case, a data delay time becomes t2−t1+0.5×UI.

As illustrated in FIG. 1, the DDR semiconductor memory device operates in synchronization with the memory clock DRAM_CLK, and the GPU operates in synchronization with the graphic clock GPU_CLK having a phase different from that of the memory clock DRAM_CLK. As a result, when a clock environment of a semiconductor memory device is different from a clock environment of a graphic processing unit, a clock signal (i.e., data trigger signal) for recognizing transferred data is mismatched to a clock signal for the transferred data.

In order to overcome the mismatch, a semiconductor memory device or a system including the semiconductor memory device presets a delay time between the semiconductor memory device and a GPU. For this purpose, separate clocks such as a read strobe signal RDQS and a write strobe signal WDQS are used. Also, specifications of the semiconductor memory device, such as an output access time tAC and a DQS output access time tDQSCK based on a reference clock, or a time difference tDQSQ between an edge of a data strobe signal and an edge of a data output signal, are used.

However, since the above-described specifications are set to preset fixed values stored in the semiconductor memory device and the GPU, it is difficult to ensure reliable data transfer when environments of an actual implemented system change. Particularly, in a high-speed system, the size of an effective data window is very small and the amount of data existing in the channel between the semiconductor memory device and the GPU is very large, so that it is difficult to ensure accurate data transfer.

Recently, in order to overcome a limitation related to ensure the accurate data transfer, using a data training, data can be accurately transferred between the semiconductor memory device and the GPU. The data training means a technology that adjusts a skew between data by using a preset data pattern in the semiconductor memory device and a controller in order to transfer data accurately which are required for a read operation and a write operation. For example, specifications for the performance of a DDRIII semiconductor memory device includes a WRITE leveling technology for compensating a time difference between a clock signal HCLK and a DQS due to delay time effect. Programmable delay elements are used for providing data strobe signals in order to satisfy timing requirements of the semiconductor memory device, which include tDQSS, tDSS and tDSH, by compensating the skew between a strobe signal and a clock signal using the WRITE leveling technology.

Recently proposed semiconductor memory devices for graphic work are designed to transfer data at rates higher than 4 Gbps, and in order to ensure high-speed data transfer, the specifications of the semiconductor memory device includes the data training.

SUMMARY OF THE INVENTION

Embodiments of the present invention are directed to providing a semiconductor memory device configured to selectively transfer a preset data pattern corresponding to a command when data is outputted according to a read operation in a semiconductor device, and an electronic equipment and a system, thereby improving reliability of high-speed data transfer.

Training is performed on data and a clock in order to improve reliability of data transfer in a semiconductor memory device operating at high speed. A data training means a technology that eliminates, by adjusting an operation clock of a graphic processing unit according to channel environments, an error due to a delay time in a data transfer process between the semiconductor memory device and the graphic processing unit. Particularly, the present invention includes a multiplexing unit that applies a trained data pattern to a global input/output line in response to a read command.

In accordance with a first aspect of the present invention, there is provided a semiconductor memory device, including: a data multiplexing unit configured to output one of a data training pattern and data transferred through a first global input/output line in response to a training control signal; and a latch unit configured to latch an output of the data multiplexing unit to apply and maintain the latched output to a second global input/output line.

In accordance with a second aspect of the present invention, there is provided a semiconductor memory device, including: a data pattern outputting unit configured to output one of a plurality of data training patterns based on a plurality of training control signals; and a read output control unit configured to apply and maintain, to a second global input/output line, one of the data training patterns outputted from the data pattern outputting unit and data transferred through a first global input/output line in response to the plurality of training control signals.

In accordance with a third aspect of the present invention, there is provided a system, including: a semiconductor memory device configured to output data after a predetermined access time in response to a read command, and output a preset data training pattern without delay of the access time in response to a training control signal generated by decoding a read training command; and a data processor configured to output the read command, receive and process the data outputted from the semiconductor memory device, output the read training command in order to determine a data delay time transferred from the semiconductor memory device, and change a phase of an operation clock after determining a delay time between an output of the read command and an arrival of the data based on the data training pattern.

DESCRIPTION OF SPECIFIC EMBODIMENTS

Hereinafter, a semiconductor memory device for transferring data at high speed in accordance with the present invention will be described in detail with reference to the accompanying drawings.

Figure 1:
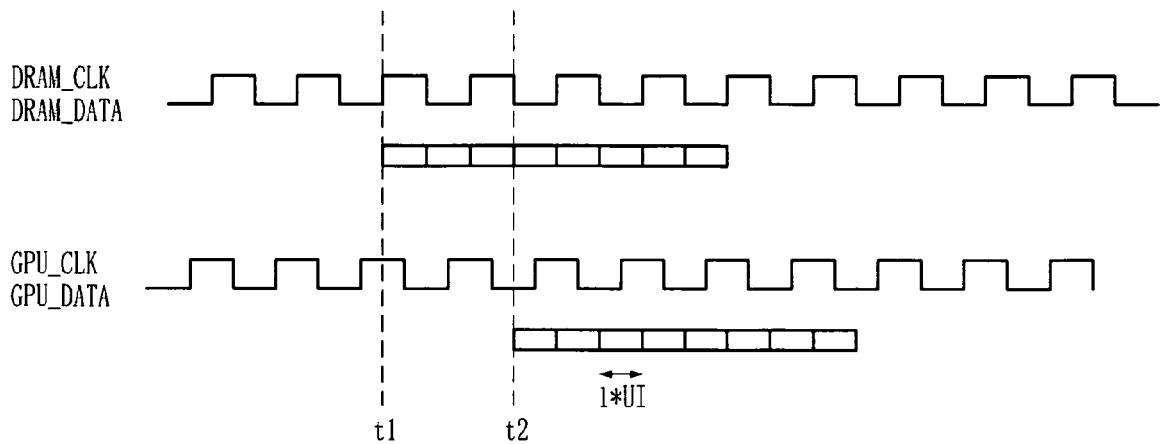
FIG. 1 is a timing diagram illustrating a read operation of a conventional semiconductor memory device.
Figure 2:
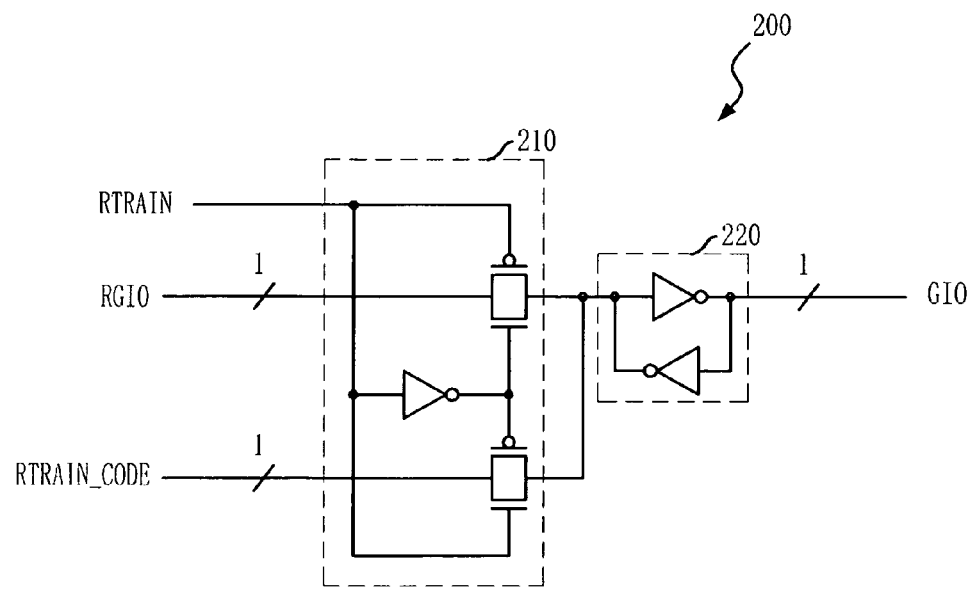
FIG. 2 is a circuit diagram of a semiconductor memory device in accordance with a first embodiment of the present invention.

FIG. 2 is a circuit diagram of a semiconductor memory device in accordance with a first embodiment of the present invention.

Referring to FIG. 2, the semiconductor memory device includes a data multiplexing unit 200 having a selector 210 and a latch 220. In response to a training control signal RTRAIN, the selector 210 outputs a data training pattern RTRAIN_CODE or data transferred through a read global input/output line RGIO. The latch 220 configured with two inverters latches an output of the selector 210.

Specifically, the selector 210 includes a first transmission gate, a second transmission gate, and an inverter. The first transmission gate outputs the data transferred through the read global input/output line RGIO in response to the training control signal RTRAIN. The second transmission gate outputs the data training pattern RTRAIN_CODE in response to the training control signal RTRAIN. The inverter inverts the training control signal RTRAIN to control the first transmission gate and the second transmission gate.

The training control signal RTRAIN is a control signal generated by the semiconductor memory device by decoding a read training command from a graphic processing unit (GPU). One bit of the data training pattern RTRAIN corresponds to one bit of a global input/output line GIO. In order to obtain the most satisfactory result, the number of bits of the data training pattern RTRAIN_CODE must be equal to the number of bits pre-fetched by the semiconductor memory device.

In the case of a read operation, when the semiconductor memory device receives a read command from the graphic processing unit, the semiconductor memory device outputs a preset data pattern through a data output path instead of data related pads, i.e., DQ, DM, DQS, /DQS, so that the graphic processing unit compensates for an additional delay by computing a timing of a read path. That is, using the preset data pattern, delay factors between the semiconductor memory device and the graphic processing unit can be determined and a delay time can be computed, and thus an operation clock of the graphic processing unit can be adjusted according to the computed delay time. The time required for the semiconductor memory device to output data corresponding to the read command is already known through the performance and specification of the semiconductor memory device, and the delay time between the semiconductor memory device and the graphic processing unit can be compensated, which is variable depending on the circumstance. Thus, reliability of data transfer is ensured even though the semiconductor memory device and the graphic processing unit operate at high speed.

In the embodiment of the present invention, the data training pattern RTRAIN_CODE corresponding to the preset data pattern is applied to the global input/output line GIO through the simple data multiplexing unit 200. The semiconductor memory device in accordance with the embodiment of the present invention can be implemented by at least modifying a related art semiconductor memory device. Thus, the semiconductor memory device does not need additional space and is adapted for use by the related art semiconductor memory device.

Figure 3:
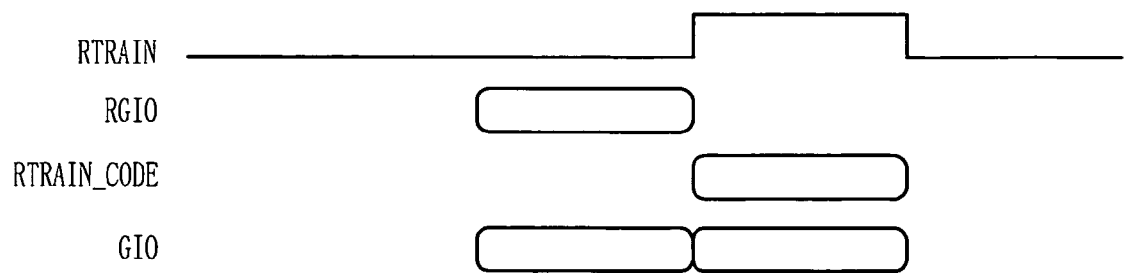
FIG. 3 is a timing diagram illustrating an operation of the semiconductor memory device of FIG. 2.

FIG. 3 is a timing diagram illustrating an operation of the semiconductor memory device of FIG. 2.

Referring to FIG. 3, when the training control signal RTRAIN is at a logic "high" level, the semiconductor memory device transfers the data training pattern RTRAIN_CODE to the global input/output line GIO. In contrast, when the training control signal RTRAIN is at a logic "low" level, the semiconductor memory device outputs data transferred through the read global input/output line RGIO.

Figure 4:
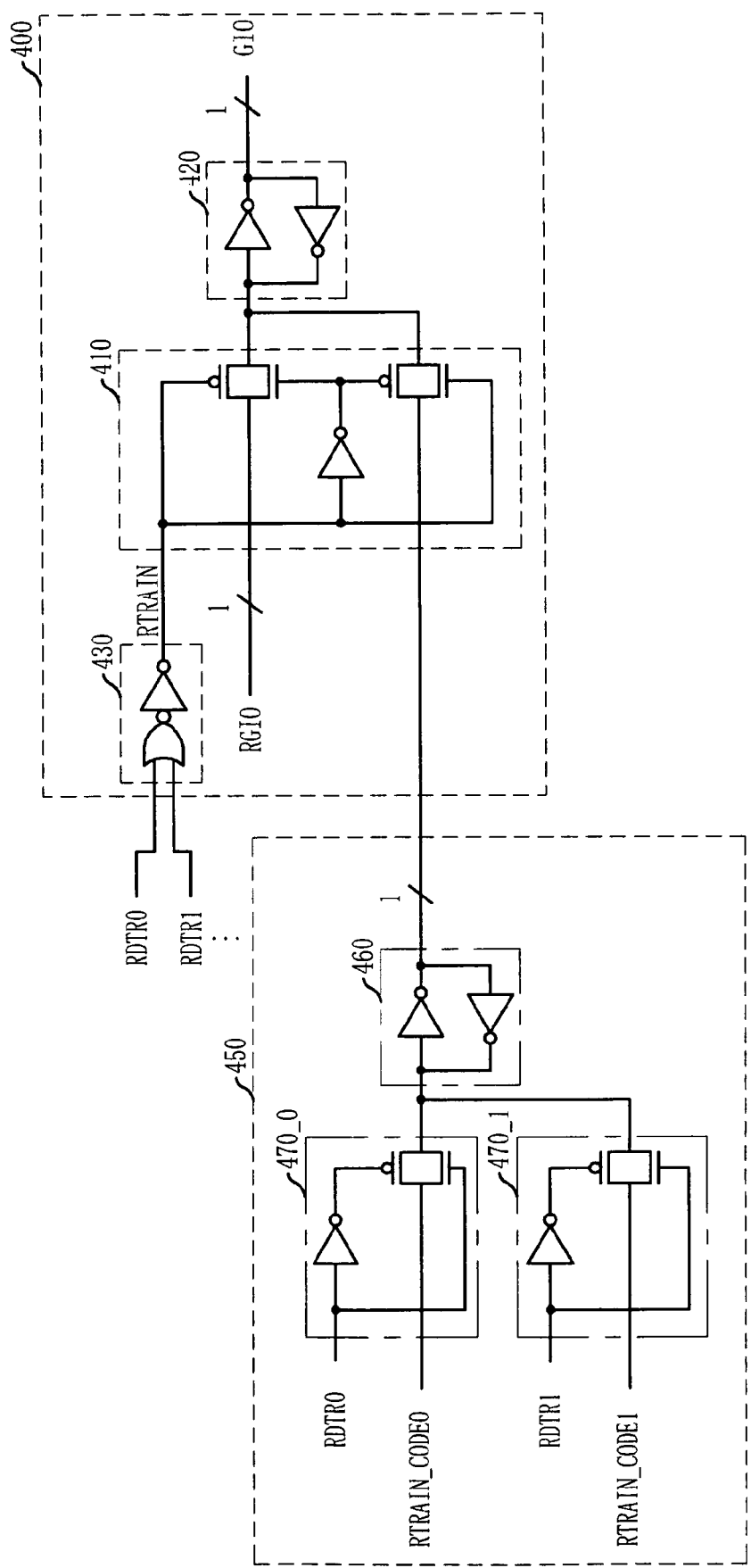
FIG. 4 is a circuit diagram of a semiconductor memory device in accordance with a second embodiment of the present invention.

FIG. 4 is a circuit diagram of a semiconductor memory device in accordance with a second embodiment of the present invention.

Referring to FIG. 4, the semiconductor memory device includes a data pattern outputting unit 450 and a data multiplexing unit 400. The data pattern outputting unit 450 outputs one of a plurality of data training patterns RTRAIN_CODE0 and RTRAIN_CODE1.

When a read training command from a graphic processing unit (GPU) is decoded to activate one of a plurality of intermediate training control signals RDTR0 and RDTR1, the data pattern outputting unit 450 transfers a data training pattern corresponding to the activated training control signal to the data multiplexing unit 400. The data multiplexing unit 400 transfers the data training pattern from the data pattern outputting unit 450 to a global input/output line GIO in response to the plurality of intermediate training control signals RDTR0 and RDTR1.

Specifically, the data pattern outputting unit 450 includes a plurality of transfer circuits 470_0 and 470_1 and a first latch 460. The first transfer circuit 470_0 determines whether the first data training pattern RTRAIN_CODE0 is transferred or not in response to the first intermediate training control signal RDTR0. The second transfer circuit 470_1 determines whether the second data training pattern RTRAIN_CODE1 is transferred or not in response to the second intermediate training control signal RDTR1. The first latch 460 latches the output of the transfer circuits 470_0 and 470_1. Each of the transfer circuits 470_0 and 470_1 includes an inverter and a transfer gate.

The data multiplexing unit 400 includes an activation detector 430, a selector 410 and a second latch 420. The activation detector 430 detects whether the plurality of intermediate training control signals RDTR0 and RDTR1 are activated, thereby outputting a training control signal RTRAIN. The selector 410 outputs one of a data training pattern outputted from the data pattern outputting unit 450 and data transferred through a read global input/output line RGIO in response to the training control signal RTRAIN outputted from the activation detector 430. The second latch 420 latches an output of the selector 410.

The activation detector 430 includes a NOR gate and an inverter. The NOR gate receives the plurality of intermediate training control signals RDTR0 and RDTR1. The inverter inverts an output of the NOR gate to output the training control signal RTRAIN. The selector 410 and the second latch 420 are similar to the selector 210 and the latch 220 of FIG. 2, respectively. Thus, their detailed description is omitted.

As described above, semiconductor memory devices in accordance with above described embodiments of the present invention apply a data training pattern to a global input/output line in response to a request of an external data processor, so that the delay time between the semiconductor memory device and the external data processor can be determined. Therefore, reliability of data transfer between a semiconductor memory device and an external data processor, which are applicable to a high-speed system, can be enhanced by using the delay time.

The present invention uses a simple multiplexing unit to apply a data pattern for a read operation to the global input/output line, thereby minimizing a circuit scale and improving degree of integration. Also, since the multiplexing unit is not complicated, a design change is easy.

In addition, the present invention can measure a delay time precisely, which varies depending on environments, in data transfer between the data processor and the semiconductor memory. Thus, an operation clock can be appropriately adjusted, so that data is accurately transferred in a high-speed system.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
    a data multiplexing unit configured to output one of a data training pattern and data transferred through a first line in response to a training control signal, wherein the data training pattern is a preset value; and
    a latch unit configured to latch an output of the data multiplexing unit to apply and maintain the latched output to a second line.

2. The semiconductor device as recited in claim 1, wherein the data multiplexing unit comprises:
    a first transfer gate configured to output the data in response to the training control signal;
    a second transfer gate configured to output the data training pattern in response to the training control signal; and
    an inverter configured to invert the training control signal to control the first transfer gate and the second transfer gate.

3. The semiconductor device as recited in claim 1, wherein the training control signal is generated by decoding a read training command.

4. A semiconductor device, comprising:
    a data pattern outputting unit configured to output one of a plurality of data training patterns, which are preset values, based on a plurality of training control signals; and
    a read output control unit configured to apply and maintain, to a second line, one of the data training patterns outputted from the data pattern outputting unit and data transferred through a first line in response to the plurality of training control signals.

5. The semiconductor device as recited in claim 4, wherein the training control signals are generated by decoding a read training command.

6. The semiconductor device as recited in claim 4, wherein the read output control unit comprises:
    an activation detector configured to detect whether the training control signals are activated;
    a data multiplexer configured to output one of the data training patterns and the data in response to an output of the activation detector; and
    a latch configured to latch the output of the data multiplexer and to apply and maintain the latched output to the second line.

7. The semiconductor device as recited in claim 6, wherein the activation detector comprises:
    a logic gate configured to perform a NOR operation on the training control signals; and
    an inverter configured to invert an output of the logic gate.

8. The semiconductor device as recited in claim 6, wherein the data multiplexer comprises:
- a first transfer gate configured to output the data in response to the output of the activation detector;
- a second transfer gate configured to output the data training pattern in response to the output of the activation detector; and
- an inverter configured to invert the output of the activation detector to control the first transfer gate and the second transfer gate.

9. The semiconductor device as recited in claim 4, wherein the data pattern outputting unit comprises:
- a plurality of transfer circuits respectively configured to determine whether the plurality of data training patterns are transferred in response to the training control signals; and
- a latch circuit configured to latch an output of the transfer circuits.

10. The semiconductor device as recited in claim 9, wherein each transfer circuit comprises:
- a transfer gate configured to output a corresponding one of the data training patterns in response to a corresponding one of the training control signals; and
- an inverter configured to invert the corresponding training control signal to control the transfer gate.

* * * * *